US012608056B2

(12) United States Patent　　　(10) Patent No.:　US 12,608,056 B2

Lan　　　　　　　　　　　　　　　(45) Date of Patent:　　　Apr. 21, 2026

(54) FIXING ELEMENT FOR HEAT DISSIPATION AND METHOD OF MOUNTING THE SAME

(71) Applicant: ASIA VITAL COMPONENTS CO., LTD., New Taipei City (TW)

(72) Inventor: Wen-Ji Lan, New Taipei City (TW)

(73) Assignee: Asia Vital Components Co., Ltd., New Taipei City (TW)

( * ) Notice: Subject to any disclaimer, the term of this patent is extended or adjusted under 35 U.S.C. 154(b) by 402 days.

(21) Appl. No.: 18/202,959

(22) Filed: May 29, 2023

(65) Prior Publication Data

US 2024/0402768 A1　　Dec. 5, 2024

(51) Int. Cl.
　*G06F 1/183*　　　(2026.01)
　*G06F 1/20*　　　(2006.01)
　*H10W 40/60*　　　(2026.01)

(52) U.S. Cl.
　CPC ................ *G06F 1/183* (2013.01); *G06F 1/20* (2013.01); *H10W 40/611* (2026.01)

(58) Field of Classification Search
　CPC ................. G06F 1/183; H01L 23/4006; H01L 2023/4081; H01L 2023/4087; H10W 40/611
　See application file for complete search history.

(56) References Cited

U.S. PATENT DOCUMENTS 6,468,011 B2 * 10/2002 Mayer ..................... F16B 21/18
　　　　　　　　　　　　　　　　411/153
6,955,512 B2 * 10/2005 Allen ....................... H05K 7/14
　　　　　　　　　　　　　　　　211/26

7,057,897 B2 * 6/2006 Leu ...................... H01L 23/4006
　　　　　　　　　　　　　　　　24/453
7,333,340 B2 * 2/2008 Zhang ................. F28D 15/0233
　　　　　　　　　　　　　　　　361/719
7,474,532 B1 * 1/2009 Desrosiers .............. H01L 23/46
　　　　　　　　　　　　　　　　165/185

(Continued)

FOREIGN PATENT DOCUMENTS

CN　　　211017061 U　　7/2020
CN　　　211951083 U　　11/2020

OTHER PUBLICATIONS

Search Report dated Mar. 4, 2024 issued by Taiwan Intellectual Property Office for counterpart application No. 112117164, 2 pages.

*Primary Examiner* — Kyle A Cook
(74) *Attorney, Agent, or Firm* — Bradley J. Thorson; DeWitt LLP

(57)　　　　　　　ABSTRACT

A method of mounting a heat dissipation device to a bare die heat source using fixing elements is disclosed. The fixing elements respectively include a screw, which has a spring fitted thereon and is disposed in a sleeve. Limiting units are provided on the sleeve for holding the spring in the sleeve in a compressed state. To mount the heat dissipation device to the bare die heat source, first use the fixing elements to preliminarily screw the heat dissipation device to a top of the heat source. Then, the springs compressed in the sleeves of all the fixing elements are elastically released synchronously to apply evenly distributed downward forces that push the heat dissipation device toward the bare die heat source stably.

6 Claims, 10 Drawing Sheets

(56)        References Cited

U.S. PATENT DOCUMENTS

| | | | | |
|---|---|---|---|---|
| 7,606,032 | B2 * | 10/2009 | Lin | F16B 35/041 |
| | | | | 361/709 |
| 8,511,956 | B2 * | 8/2013 | Liu | H01L 23/4006 |
| | | | | 411/107 |
| 8,585,336 | B2 * | 11/2013 | Tao | F16B 5/0266 |
| | | | | 411/347 |
| 8,979,458 | B2 * | 3/2015 | Sun | H01L 23/4006 |
| | | | | 411/353 |
| 9,113,567 | B2 * | 8/2015 | Stotz, Jr. | H05K 7/12 |
| 10,943,848 | B1 * | 3/2021 | Yatskov | H01L 23/4006 |
| 2006/0262506 | A1 * | 11/2006 | Lee | H01L 23/4006 |
| | | | | 257/E23.084 |
| 2007/0230125 | A1 * | 10/2007 | Lo | H01L 23/467 |
| | | | | 257/E23.084 |
| 2009/0154110 | A1 * | 6/2009 | Ma | H01L 23/4006 |
| | | | | 361/720 |
| 2010/0002381 | A1 * | 1/2010 | Min | H01L 23/4006 |
| | | | | 29/729 |
| 2011/0110040 | A1 * | 5/2011 | Liu | H01L 23/4006 |
| | | | | 361/696 |
| 2011/0114295 | A1 * | 5/2011 | Chiu | H01L 23/4006 |
| | | | | 165/185 |
| 2012/0073104 | A1 * | 3/2012 | Laursen | F16B 31/028 |
| | | | | 411/9 |
| 2012/0189400 | A1 * | 7/2012 | Chiu | F16B 5/0208 |
| | | | | 411/82 |
| 2012/0195711 | A1 * | 8/2012 | Chiu | F16B 5/0208 |
| | | | | 411/103 |
| 2012/0224935 | A1 * | 9/2012 | Chiu | F16B 5/0208 |
| | | | | 411/352 |
| 2021/0045254 | A1 * | 2/2021 | Zhang | H05K 1/18 |
| 2023/0129211 | A1 * | 4/2023 | Twiss | H05K 13/0882 |
| | | | | 361/709 |
| 2023/0371208 | A1 * | 11/2023 | McKerlie | H05K 7/2049 |
| 2024/0421033 | A1 * | 12/2024 | Miwa | H01L 23/4093 |

* cited by examiner

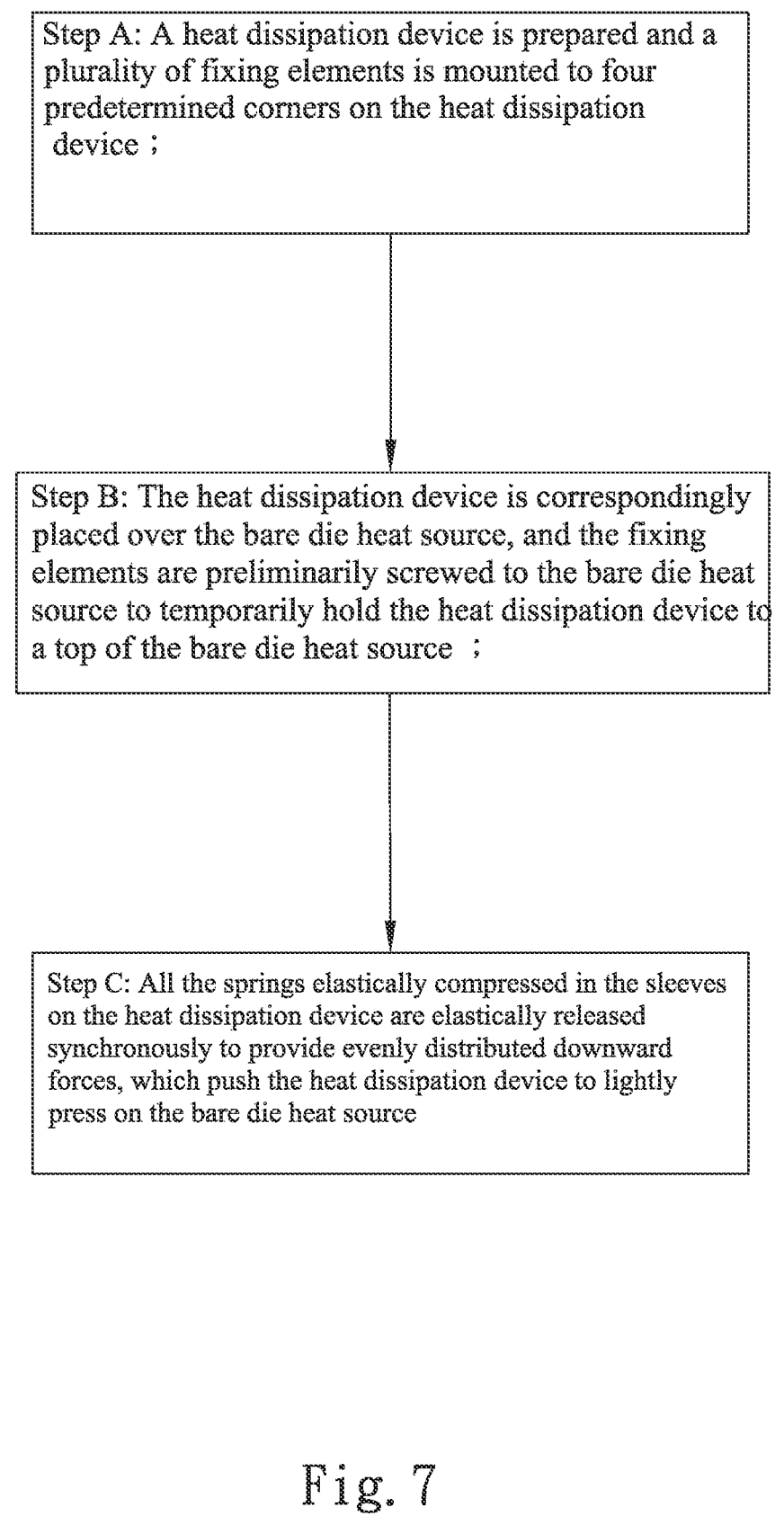

Step A: A heat dissipation device is prepared and a plurality of fixing elements is mounted to four predetermined corners on the heat dissipation device ;

Step B: The heat dissipation device is correspondingly placed over the bare die heat source, and the fixing elements are preliminarily screwed to the bare die heat source to temporarily hold the heat dissipation device to a top of the bare die heat source ;

Step C: All the springs elastically compressed in the sleeves on the heat dissipation device are elastically released synchronously to provide evenly distributed downward forces, which push the heat dissipation device to lightly press on the bare die heat source

Fig. 7

FIXING ELEMENT FOR HEAT DISSIPATION AND METHOD OF MOUNTING THE SAME

FIELD OF THE INVENTION

The present invention relates to a fixing element for mounting heat dissipation device and a method of mounting the heat dissipation device to a bare die heat source using the fixing elements. With the method of the present invention, the fixing elements can apply evenly distributed downward forces synchronously to push the heat dissipation device toward the bare die heat source without causing damaged bare die or thermal resistance due to uneven and asynchronous contact of the heat dissipation device with the bare die heat source.

BACKGROUND OF THE INVENTION

Nowadays, high performance and high power chips are used in electronic devices for the latter to provide highly enhanced computing power. The chip in processing data will produce a relatively high amount of heat to form a heat source. Conventionally, the chip is packaged or encapsulated to avoid the chip from being damaged. With the enhanced computing power thereof, the chip in processing data produces even more heat than ever before. However, the package of the chip adversely affects the produced heat from efficiently dissipating into outer environment. Therefore, many currently available chips are provided in the form of bare dies without any package to protect their surfaces. The non-packaged bare die has a non-smooth and convex surface and accordingly, has a relatively small and weak contact area between it and a heat dissipation device for heat exchange. Thus, the bare die is subjected to damage and breaking when the heat dissipation device is connected thereto.

Conventionally, to fix the heat dissipation device to a top of the heat source (i.e. the bare die), a plurality of fixing points on the heat dissipation device are sequentially screw tightened to the bare die one by one. Since the fixing points are not tightened synchronously, the heat dissipation device in contact with the heat source tends to be skewed relative to the latter. The bare die subjected to uneven distribution of pressure over it is easily broken and damaged.

Please refer to FIGS. 1 and 2, which show a conventional manner of fixing a heat dissipation device C to a heat source A in the form of a bare die. As shown, the bare die A is placed on a base D. Four corners of the base D correspondingly located outside the heat source A are provided with an internally threaded copper sleeve rod B each. The heat dissipation device C also has four holes C3 formed corresponding to the four copper sleeve rods B for a screw unit C1 to extend through each of the holes C3. Each of the screw units C1 has a spring C2 fitted therearound. To lay the heat dissipation device C to the top of the heat source A, the screw units C1 are sequentially threaded through the holes C3 into corresponding copper sleeve rods B one by one with a power screwdriver handled manually or by a mechanical arm. To shorten the fixing time on a production line and complete the fixing operation within a limited time period, each of the screw units C1 is fully tightened in one movement at a very quick speed. As soon as the screw unit C1 is fully tightened, the spring C2 fitted therearound is also compressed in a direction toward the heat source A. The screw units C1 individually tightened at a quick speed and the springs C2 quickly compressed toward the heat source A tend to result in uneven and asynchronous distribution of downward forces over four corners of the base D and accordingly the heat source A. And, the heat source A, i.e. the bare die, being fragile and breakable, is easily damaged under uneven force application thereto.

The bare die is so fragile that even downward forces must be synchronously applied by the heat dissipation device to the four corners of the base carrying the bare die to ensure successful fixing of the heat dissipation device to the top of the bare die. In the event the four corners of the base are subjected to unevenly and asynchronously applied forces from the heat dissipation device, warp of the bare die or the heat dissipation device might occur to cause incomplete contact and thermal resistance between the two parts. In some worse conditions, the warped bare die might become damaged and non-usable and the thermal resistance might lead to uneven heat distribution over or inactive heat conduction of the heat dissipation device.

It is therefore tried by the inventor to find ways to enable the heat dissipation device to apply even and synchronous forces to the heat source to ensure complete and close contact between them, to maintain proper binding force between the bare die and the heat dissipation device with reliable fixing unit, and to make the fixing unit repeatedly usable or adjustable.

SUMMARY OF THE INVENTION

To effectively solve the problems in the prior art, a primary object of the present invention is to provide a fixing element for mounting a heat dissipation device and a method of mounting the latter, such that synchronous and even downward forces can be applied by the fixing elements to the heat dissipation device, allowing the heat dissipation device to connect to a bare die heat source stably to avoid broken or collapsed edges of the bare die as would occur in the prior art where the fixing elements are tightened one by one to produce uneven downward forces toward the bare die heat source.

To achieve the above and other objects, the fixing element according to the present invention for mounting a heat dissipation device to a bare die heat source includes a screw, a spring, and a sleeve.

The screw has the spring fitted thereon, and is provided at a lower end with a retaining ring for a bottom end of the spring to press thereon, so that the spring is prevented from moving axially downward out of the screw.

The sleeve is a tube-like structure having two open ends and internally defines a receiving space, which is communicable with the two open ends of the sleeve and has the screw and the spring received therein. Limiting units may be provided on the sleeve to abut on or interfere with a top end of the spring, so that the spring is limited in the receiving space of the sleeve in a compressed state.

To achieve the above and other objects, the method according to the present invention for mounting a heat dissipation device to a bare die heat source using the above described fixing elements to ensure evenly contact of the heat dissipation device with the bare die heat source includes the following steps:

Step A, in which a heat dissipation device is prepared and a plurality of fixing elements is mounted to four predetermined corners on the heat dissipation device;

Step B, in which the heat dissipation device is correspondingly placed over the bare die heat source, and the fixing elements are preliminarily screwed to the bare die heat source to temporarily hold the heat dissipation device to a top of the bare die heat source; and Step C, in which all the springs elastically compressed in the sleeves on the heat dissipation device are elastically released synchronously to provide evenly distributed downward forces, which push the heat dissipation device to lightly press on the bare die heat source.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein

FIG. 7 is a flow chart showing the steps included in a method of the present invention for connecting a heat dissipation device to a bare die heat source using the fixing elements of the present invention;

DETAILED DESCRIPTION OF THE PREFERRED EMBODIMENTS

Figure 1:
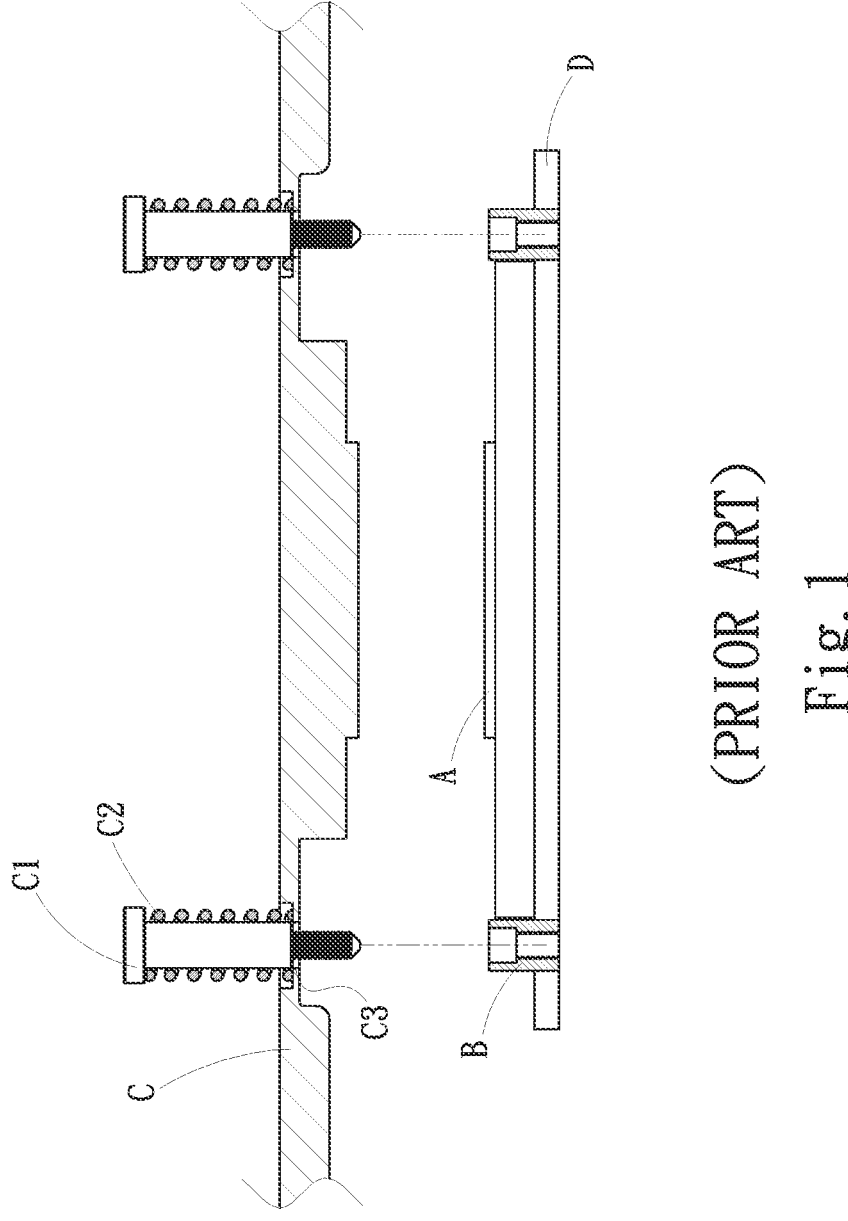
FIG. 1 shows how a heat dissipation device is connected to a heat source in the prior art.
Figure 2:
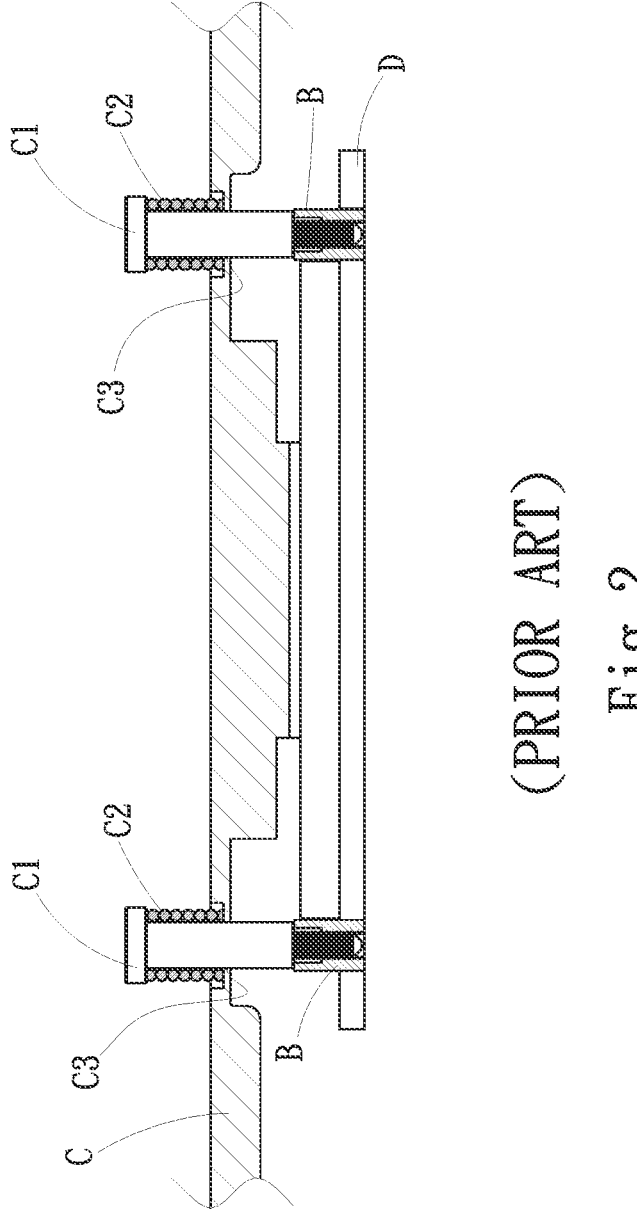
FIG. 2 shows the heat dissipation device and the heat source of FIG. 1 after being connected to each other.

The present invention will now be described with some preferred embodiments thereof. For the purpose of easy to understand, elements that are the same in the preferred embodiments are denoted by the same reference numerals.

Figure 3:
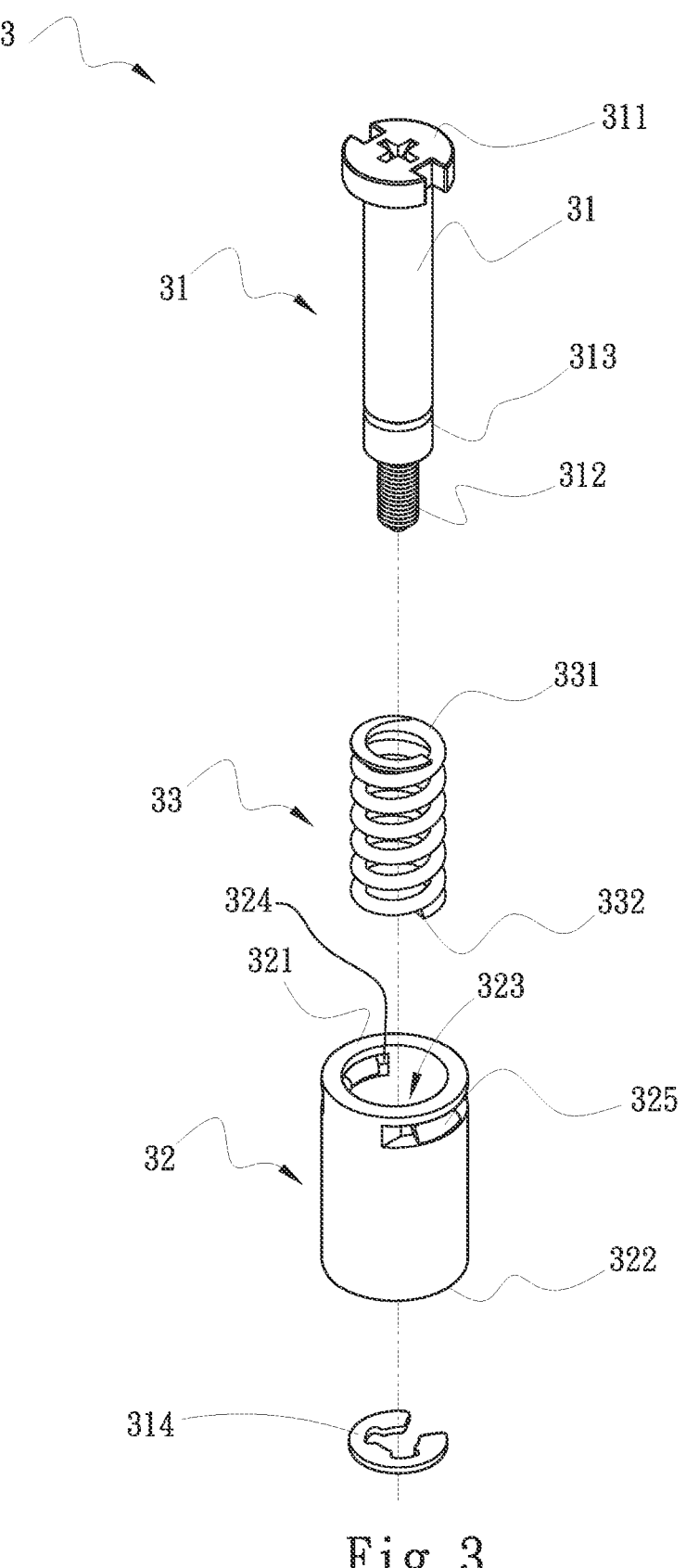
FIG. 3 is an exploded perspective view of a fixing element for heat dissipation device according to a preferred embodiment of the present invention.
Figure 4:
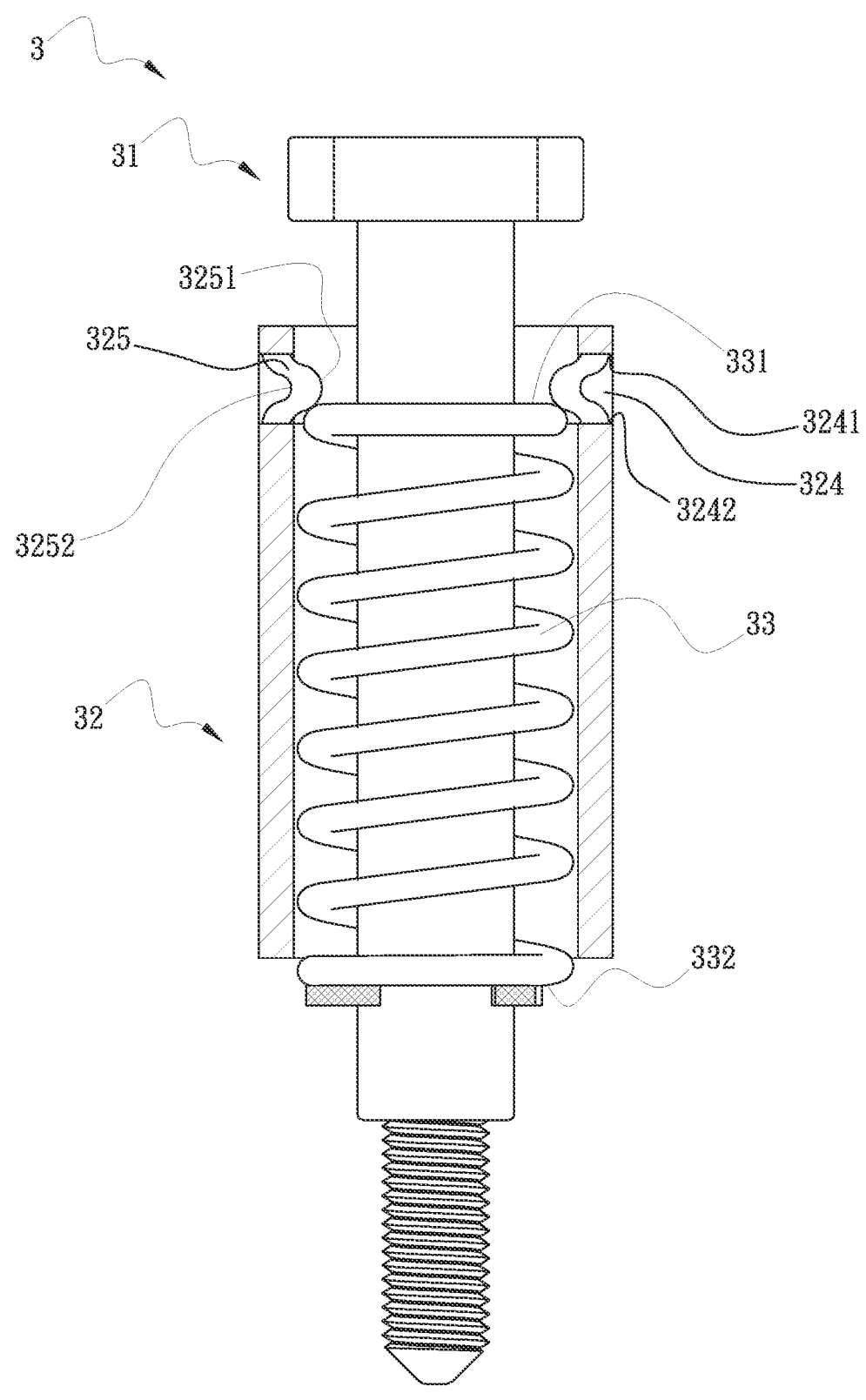
FIG. 4 is an assembled sectional side view of the fixing element of FIG. 3.
Figure 5:
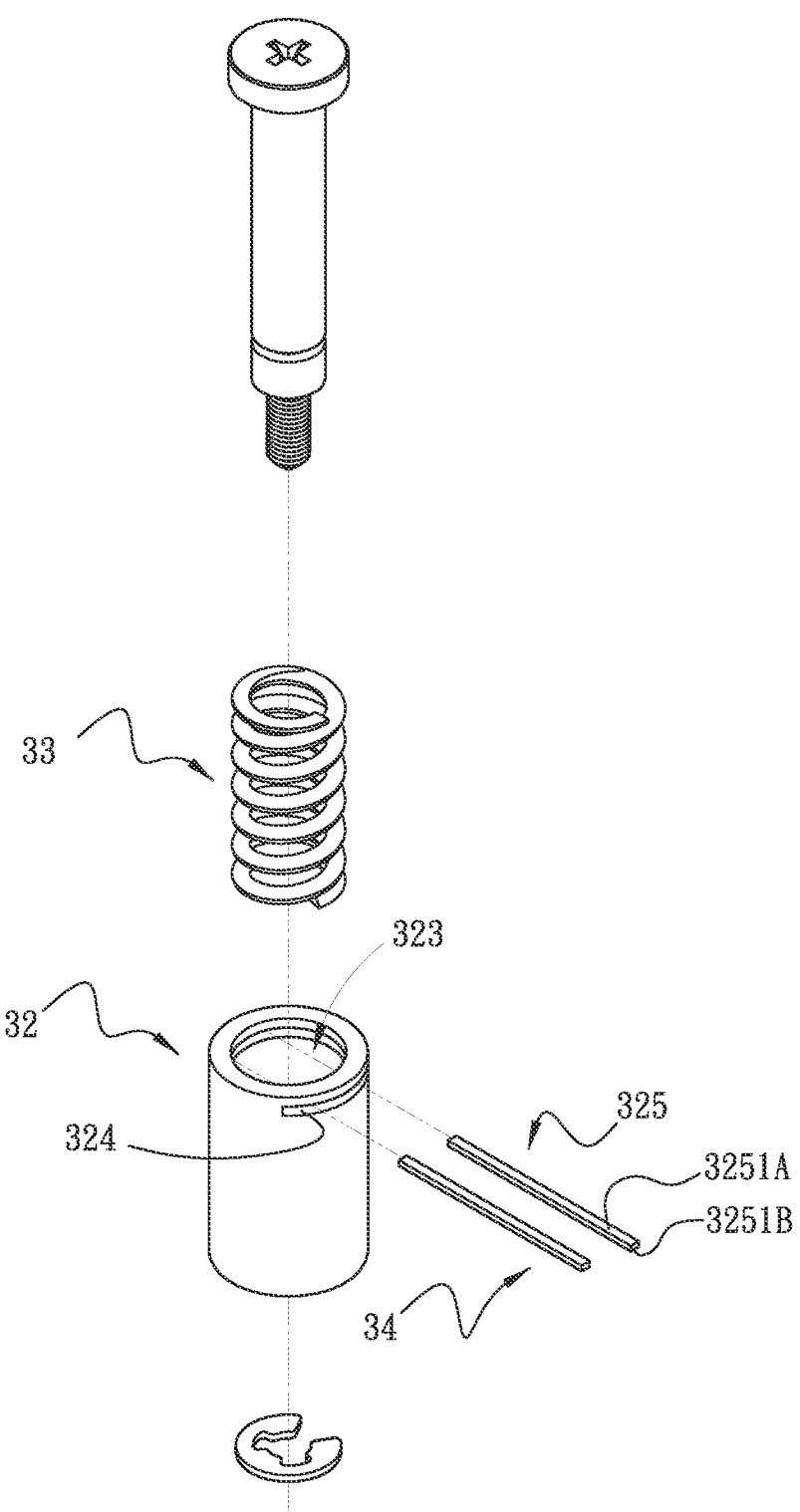
FIG. 5 is an exploded perspective view of a fixing element for heat dissipation device according to an alternative embodiment of the present invention.
Figure 6:
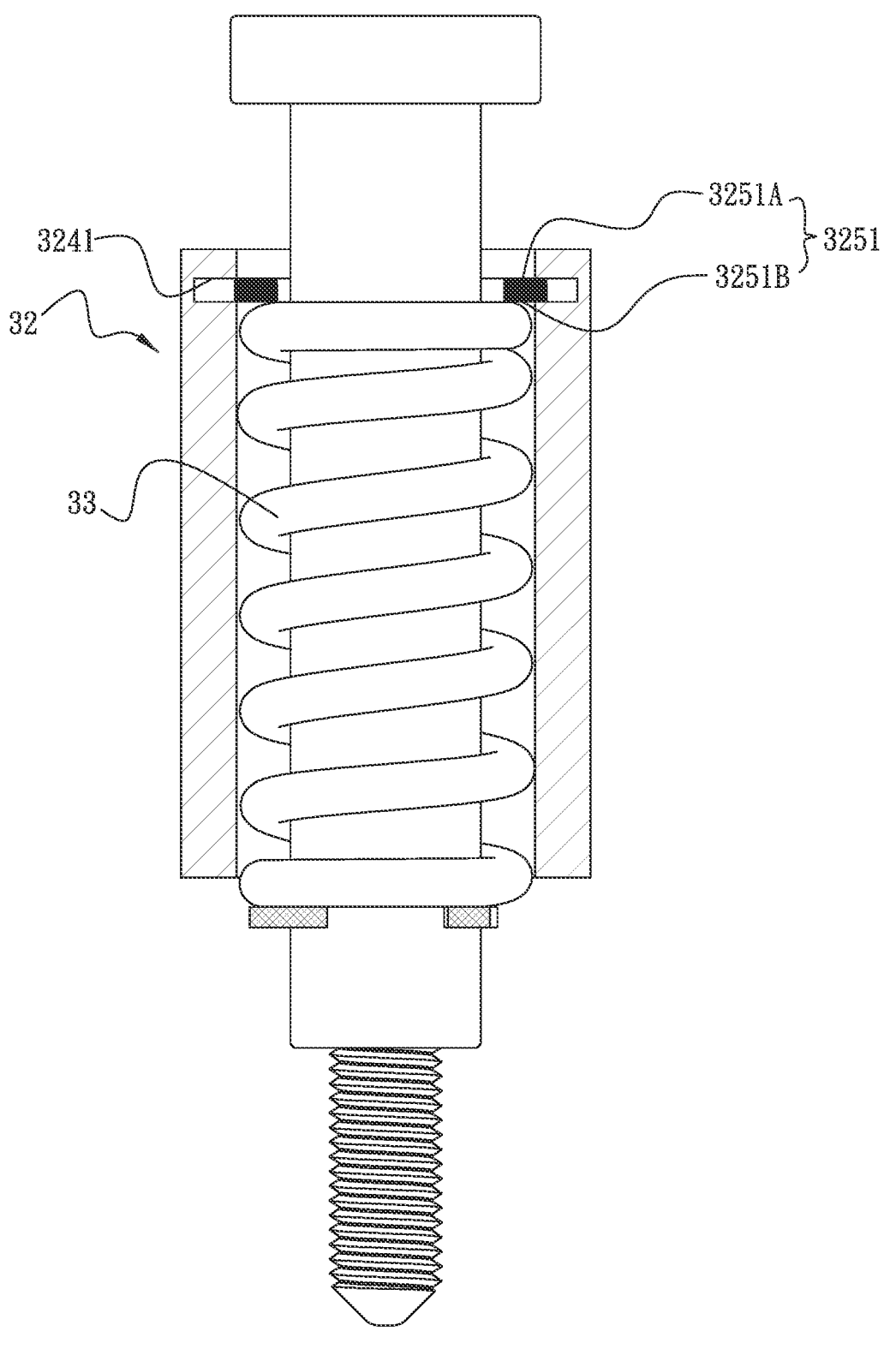
FIG. 6 is an assembled sectional view of the fixing element of FIG. 5.

Please refer to FIGS. 3 and 4, which are exploded perspective view and assembled sectional side view, respectively, of a fixing element 3 according to a preferred embodiment of the present invention; and to FIGS. 5 and 6, which are exploded perspective view and assembled sectional side view, respectively, of a fixing element 3 according to an alternative embodiment of the present invention. As shown, the fixing element 3 includes a screw 31 and a sleeve 32.

The screw 31 includes a screw head 311 and a plurality of male threads 312 provided at an upper and a lower end thereof, respectively; an annular groove 313 formed closely above the male threads 312 for receiving a retaining ring 314 therein; and a spring 33 fitted on around the screw 31 and located between the screw head 311 and the retaining ring 314 with a bottom end 332 of the spring 33 pressed against one side of the retaining ring 314. The retaining ring 314 limits the bottom end 332 of the spring 33 from excessively extending axially downward to move out of the lower end of the screw 31.

The sleeve 32 is a tube-like structure and has an open upper end 321, an open lower end 322, and a receiving space 323 defined between and communicable with the upper and the lower end 321, 322. The screw 31 and the spring 33 fitted on the screw 31 are receiving in the receiving space 323 of the sleeve 32. A pair of windows 324 is formed on the sleeve near the upper end 321 thereof. The windows 324 are located at two diametrically opposite positions on the sleeve 32 to space from each other by 180 degrees. The windows 324 are extended from an outer surface of the sleeve 32 into the receiving space 323 to communicate with the receiving space 323.

The sleeve 32 can include or be used with a pair of limiting units 325, which is pressed on a top end 331 of the spring 33. In the preferred embodiment, the limiting units 325 are integrally formed on the sleeve 32. In an alternative embodiment, the limiting units 325 are pre-formed elements additionally connected to the sleeve 32 for use with the sleeve 32. The limiting units 325 can limit and compress the spring 33 in the receiving space 323 of the sleeve 32 by directly abutting on or interfering with the spring 33.

In the preferred embodiment, the limiting units 325 are formed on a wall of the sleeve 32 to become integral parts of the sleeve 32. The windows 324 on the sleeve 32 respectively have an upper edge 3241 and a lower edge 3242. The limiting units 325 are connected at two ends thereof to the upper and the lower edges 3241, 3242 of the two windows 324. In the preferred embodiment, the limiting units 325 are movable or flexible bodies radially protruded toward the receiving space 323, and respectively include a first surface 3251 and a second surface 3252, which are located at radially inner and outer surface of the limiting unit 325, respectively. At least one of the first and the second surface 3251, 3252 is a convex surface. The first surfaces 3251 are protruded toward the receiving space 323 to press on the top end 331 of the spring 33, such that the spring 33 is elastically compressed and limited from moving axially upward. When the limiting units 325 are subjected to an external downward force, they will be squeezed to deform, causing the first surfaces 3251 to change from the radially inward protruded state to a radially outward recessed state at the windows 324. As a result, the second surfaces 3252, which were initially in a radially inward recessed state, are changed to radially outward protrude from the windows 324 on the sleeve 32.

In the alternative embodiment, the limiting units 325 are external elements usable with the sleeve 32 to achieve the purpose of limiting and compressing the spring 33. In this case, the limiting units 325 are extended into, set in, inserted into, or snapped onto the receiving space 323 of the sleeve 32 via the windows 324, so as to interfere with or press on the top end 331 of the spring 33 and limit the spring 33 in the receiving space 323 of the sleeve 32. The limiting units 325 may be present in various forms, such as two flat pieces, two plates, two sticks, two annular members, or any other suitable geometric bodies. In the illustrated alternative embodiment, the limiting units 325 are shown as two transverse sticks. However, it is understood the example of transverse sticks are not intended to limit the present invention in any way. In this case, the limiting units 325 respectively have an upper surface 3251A and a lower surface 3251B, as shown in FIG. 5, and are radially extended into the receiving space 323 of the sleeve 32 via the windows 324 to limit and compress the top end 331 of the spring 33. The upper surfaces 3251A of the limiting units 325 (i.e. the two transverse sticks) are abutted against the upper edges 3241 of the windows 324 for the lower surfaces 3251B of the transverse sticks 325 to press on the top end 331 of the spring 33, such that the spring 33 is compressed in the sleeve 32. The limiting units 325 in the form of two transverse sticks can be removed from the windows 324, so that the spring 33 is no longer limited by the limiting units 325 and allowed to release its elastic restoring force.

Figure 8:
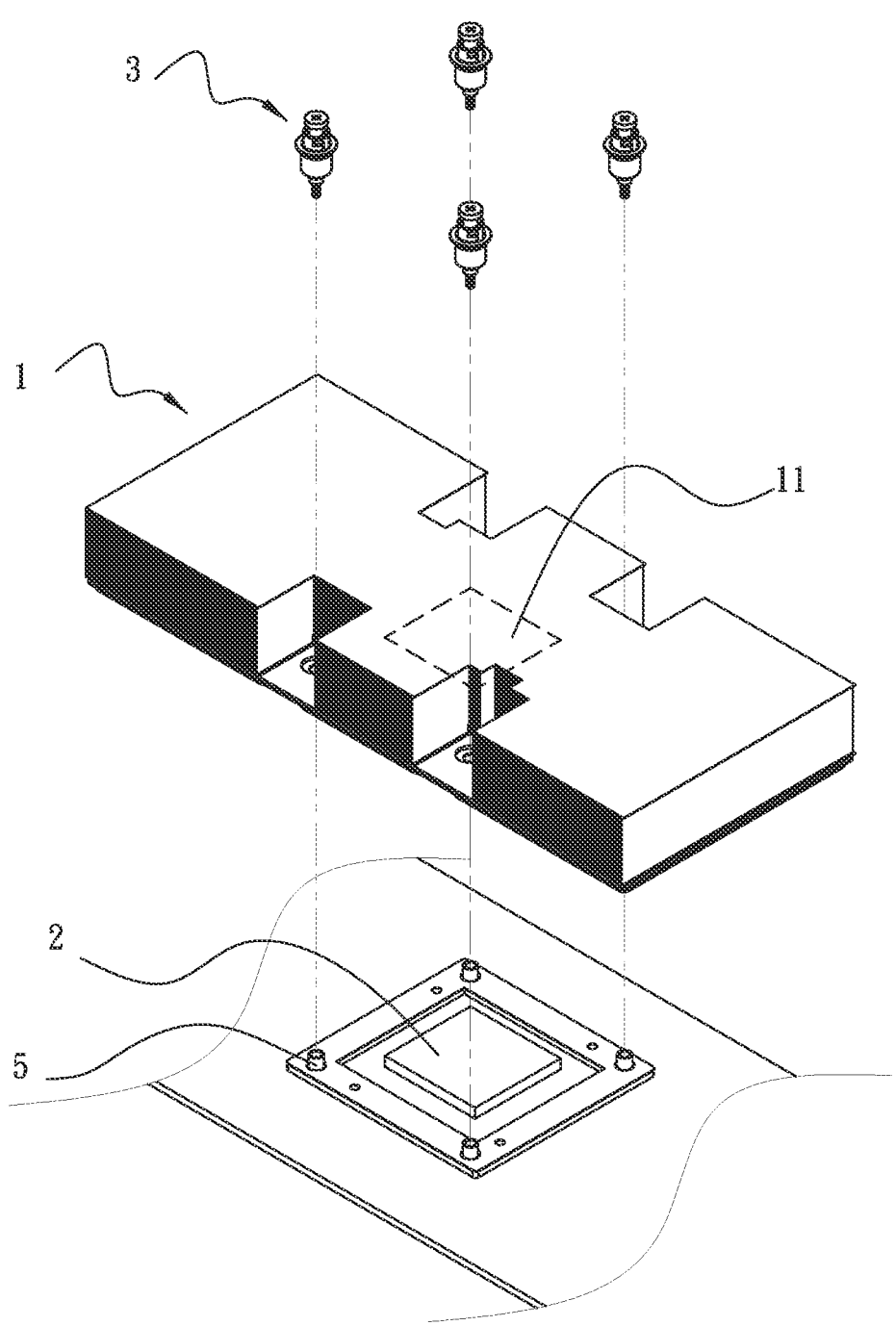
FIG. 8 is an exploded perspective view showing a heat dissipation device according to the present invention and the use of the fixing elements of the present invention to connect the heat dissipation device to a bare die heat source.

Please refer to FIGS. 7 to 10. Wherein FIG. 7 is a flow chart showing the steps included in a method of the present invention for connecting a heat dissipation device 1 to a bare die heat source 2; FIG. 8 shows the heat dissipation device 1 is connected to the bare die heat source 2 using fixing elements 3; and FIGS. 9 and 10 pictorially show how the fixing elements 3 according to the preferred and the alternative embodiment of the present invention, respectively, are operated to synchronously release even downward elastic forces to push the heat dissipation device 1 toward the bare die heat source 2. The method includes the follow steps A, B and C.

In the Step A, a heat dissipation device 1 is prepared and a plurality of the fixing elements 3 is mounted to four predetermined corners on the heat dissipation device 1.

More specifically, the present invention wants to provide a method of mounting a heat dissipation device 1 to a bare die heat source 2 to achieve heat transfer and heat exchange between the heat dissipation device 1 and the bare die heat source 2. Since the bare die heat source 2 does not have any protective structure provided on its outer surface, even downward forces must be synchronously applied to the heat dissipation device 1 to ensure the bare die heat source 2 is not damaged due to uneven downward pressure applied thereto by the heat dissipation device 1. For the heat dissipation device 1 to apply synchronous and even downward forces to the bare die heat source 2 when it is to be connected to the bare die heat source 2, a fixing element 3 structurally different from the conventional screw unit C1 is provided by the present invention for use with the heat dissipation device 1. Since different embodiments of the fixing element 3 have been described above with reference to FIGS. 3 to 6, they are not repeatedly described herein.

As shown in FIG. 8, the heat dissipation device 1 has a heat receiving zone 11, which is to be aligned with and attached to the bare die heat source 2. The fixing element 3 is mounted in each of four corners outside the heat receiving zone 11. The fixing elements 3 mounted in the four corners outside the heat receiving zone 11 on the heat dissipation device 1 are designed to apply even downward forces to the four corners when the heat dissipation device 1 is connected to the bare die heat source 2. To achieve this purpose, the fixing elements 3 at four corners must be synchronously pressed down against the heat dissipation device 1, so that the heat dissipation device 1 can be in close contact with the bare die heat source 2 without producing any thermal resistance between them or causing damage to the bare die.

The screws 31 of the fixing elements 3 are extended through the heat dissipation device 1 from their externally threaded lower ends, the retaining rings 314 are then set in the annular grooves 313, such that the retaining rings 314 are pressed on a lower side of the heat dissipation device 1 while the springs 33 and the sleeves 32 are pressed their lower ends on an upper side of the heat dissipation device 1. In this way, the fixing elements 3 are temporarily held on the heat dissipation device 1.

In the Step B, the heat dissipation device 1 is correspondingly placed over the bare die heat source 2, and the fixing elements 3 are preliminarily screwed to the bare die heat source 2 to temporarily hold the heat dissipation device 1 to a top of the bare die heat source 2.

More specifically, the bare die heat source 2 is a heat source on a substrate, such as a circuit board. To facilitate convenient connecting of the heat dissipation device 1 to the bare die heat source 2, four corners on the substrate outside and near the bare die heat source 2 are usually provided with an internally threaded copper sleeve rod 5 each for meshing with the male threads 312 of the fixing element 3, so as to preliminarily hold the heat dissipation device 1 and the bare die heat source 2 in place. At this point, the heat dissipation device 1 is only lightly laid over the bare die heat source 2 without being tightly fastened to the latter. That is, the heat dissipation device 1 has not yet applied any downward pressure to the bare die heat source 2.

In the Step C, all the springs 33 elastically compressed in the sleeves 32 on the heat dissipation device 1 are elastically released synchronously to provide evenly distributed downward forces, which push the heat dissipation device 1 to lightly press on the bare die heat source 2.

More particularly, in the step C, also the last step of the method of the present invention, all the springs 33 on the heat dissipation device 1 must be synchronously released from the compressed state to full release their elastic restoring forces, so that the four corners of the heat dissipation device 1 are subjected to synchronous and evenly distributed downward forces from the springs 33 to thereby closely contact with the bare die heat source 2.

Please refer to FIGS. 3 to 6 again. In both of the preferred embodiment and the alternative embodiment of the present invention, the spring 33 is interfered with by the limiting units 325 to stay in a compressed state in the sleeve 32. For the spring 33 to release its elastic restoring force, it is necessary to remove the limiting units 325 from interfering with or abutting on the spring 33, so that the spring 33 can elastically push its top end 331 upward against the screw head 311 and its bottom end 332 downward against the upper side of the heat dissipation device 1, allowing the heat dissipation device 1 to be pushed toward and closely contact with the bare die heat source 2.

Figure 9:
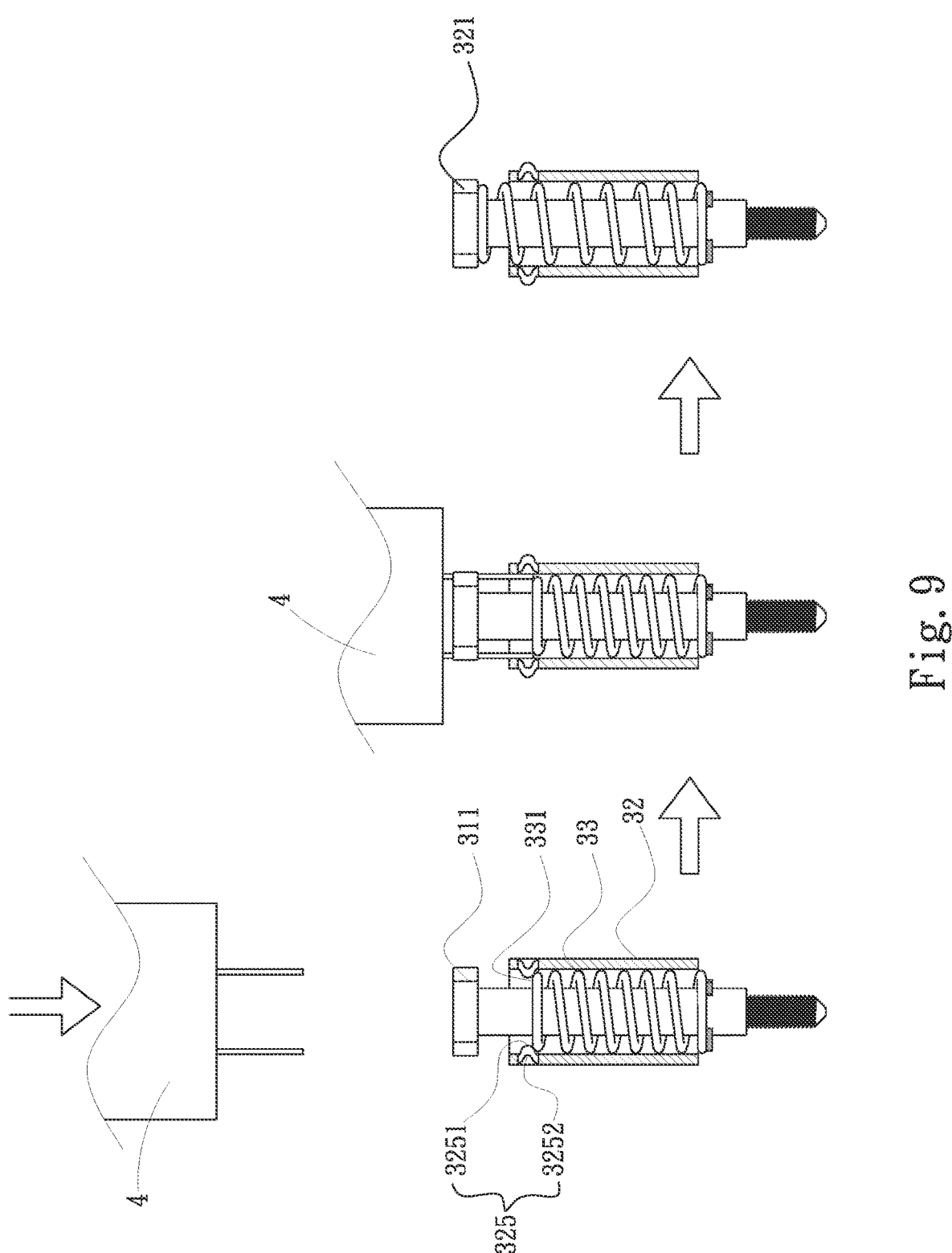
FIG. 9 pictorially shows how the fixing element according to the preferred embodiment of the present invention is elastically released to evenly push the heat dissipation device toward the bare die heat source.
Figure 10:
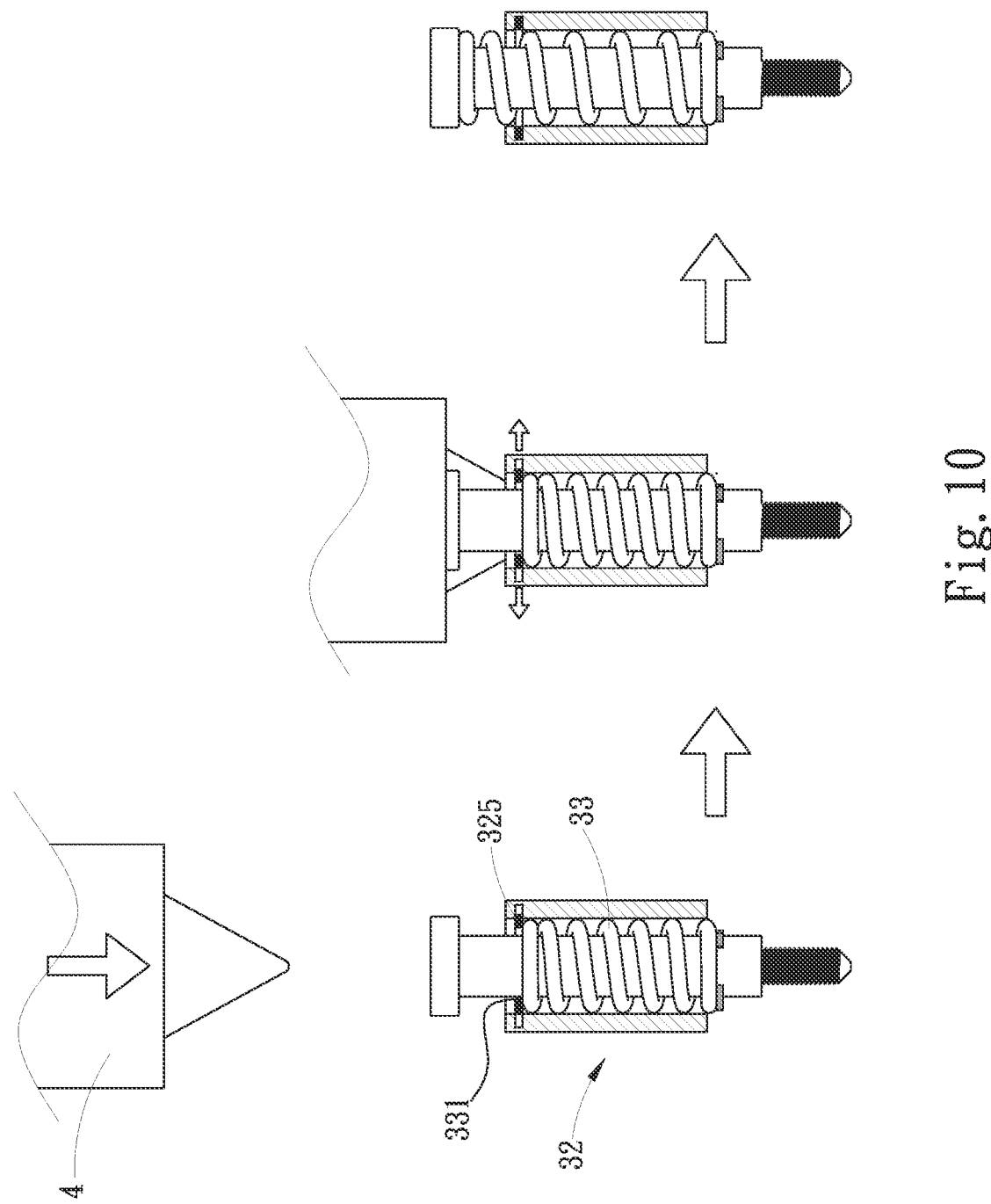
FIG. 10 pictorially shows how the fixing element according to the alternative embodiment of the present invention is elastically released to evenly push the heat dissipation device toward the bare die heat source.

Please refer to FIGS. 9 and 10. To remove all the limiting units 325 of the sleeves 32 from interfering with or abutting on the top ends 331 of the springs 33, an external force can be applied to the limiting units 325 manually or by an automated apparatus (not shown), or by tools used along with the automated apparatus. In the illustrated embodiments of the present invention, a pressing tool 4 is designed to remove the limiting units 325 from abutting on the spring 33. It is understood the pressing tool 4 is only a non-restrictive example and not intended to limit the present invention in any way. In other operable embodiments, mechanical equipment may be used to actuate the limiting units 325 directly.

In the preferred embodiment of the present invention, the pressing tool 4 used is configured as shown in FIG. 9. The pressing tool 4 is individually aligned with the limiting units 325 on the sleeve 32 of the fixing element 3. When the mechanical equipment applies a downward pressure to all the pressing tools 4, the pressing tools 4 are brought to press on the first surfaces 3251 of the limiting units 325 synchronously, forcing the radially inward protruded limiting units 325 to deform toward the windows 324 and no longer interfere with the top ends 331 of the springs 33, so that the previously compressed springs 33 release their elastic restoring forces synchronously.

In the alternative embodiment of the present invention, the pressing tool 4 used is configured as shown in FIG. 10, and the limiting units 325 are external elements extended through the windows 324 from an outer side into the receiving space 323 of each sleeve 32. In this case, simply pull the limiting units 325 in a radially horizontal direction to achieve the purpose of removing the limit units 325 from the spring 33 for the latter to release its elastic restoring force.

Please refer to FIGS. 5 and 10. In the alternative embodiment of the present invention, the limiting units 325 are two external elements, which are two transverse sticks in the illustrated alternative embodiment. The transverse sticks are horizontally located and parallelly spaced from each other, and are radially inward extended through the windows 324 across the receiving space 323 in the sleeve 32. The two parallel sticks are so spaced that their lower surfaces 3251B can press on the top end 331 of the spring 33 in the sleeve 32. To remove the two sticks from the spring 33, it is necessary to increase a distance between the two parallel sticks, so that the spring 33 is no longer pressed by the sticks and can return to it initial state without being compressed.

The pressing tool 4 used in the alternative embodiment is so configured that it gradually moves the two sticks radially outward to increase the distance between them when the pressing tool 4 is vertically moved down toward the two sticks. When the distance between the two sticks is increased to an extent that the sticks no longer press on the top end 331 of the spring 33, the spring 33 can fully release its elastic restoring force upward to push against the screw head 311.

The method according to the present invention for mounting the heat dissipation device 1 to the bare die heat source 2 using fixing elements 3 is technically characterized in that the fixing elements 3 can provide synchronous and evenly distributed downward forces for pushing the heat dissipation device 1 to evenly and closely contact with the bare die heat source 2 without causing a warped, broken or collapsed bare die.

There are many different ways to temporarily hold the spring in the compressed state, many ways and structures for synchronously releasing the spring at the time the heat dissipation device is about to be attached to the bare die heat source, and many different manners of operating the limiting units to release the spring from the compressed state. For example, the limiting units may be axially slid, radially twisted, or horizontally moved away from the sleeve to release the spring from the compressed state. While only two different embodiments are described herein, it is understood the present invention is not limited thereto in any way.

In brief, the technical means adopted by the present invention mainly lies in the elastic releasing of the springs on the heat dissipation device synchronously, so as to apply evenly distributed downward forces to the heat dissipation device, allowing the latter to evenly press on and contact with the bare die heat source without damaging the bare die.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A mounting method applied to a plurality of fixing elements for a heat dissipation device, each fixing element of the plurality comprising a screw having an upper end and a lower end, a screw head provided on the upper end and a plurality of male threads provided on the lower end, an annular groove formed axially above the male threads for and receiving a retaining ring therein, and a spring fitted on the screw between the screw head and the male threads, the spring having a top end and a bottom end, and a tubular sleeve with an open lower end and an open upper end and internally defining a receiving space therebetween, in which the screw and the spring fitted thereon are received, the sleeve being provided with two limiting units contacting the top end of the spring, so that the spring is held in the receiving space, the mounting method comprising the following steps:

preparing a heat dissipation device, and mounting the fixing elements to four predetermined corners on the heat dissipation device with a portion of the heat dissipation device disposed between the retaining ring and the bottom end of the spring;

placing the heat dissipation device over a bare die heat source, and screwing the fixing elements preliminarily to the bare die heat source to temporarily hold the heat dissipation device to a top of the bare die heat source; and synchronously displacing the limiting units of each fixing unit to enable the top end of the spring of each fixing unit to contact the respective screw head, thereby providing an evenly distributed downward force which pushes the heat dissipation device to press on the bare die heat source.

2. The mounting method as claimed in claim 1, wherein the lower ends of the sleeves of the fixing elements and the bottom ends of the springs are pressed against an upper side of the heat dissipation device, the retaining rings of the fixing elements are pressed on a lower side of the heat dissipation device, and the fixing elements are extended through the heat dissipation device to screw to a substrate carrying the bare die heat source.

3. The mounting method as claimed in claim 1, wherein the sleeve has a pair of windows, which respectively have an upper edge and a lower edge, and are radially extended from an outer side of the sleeve into the receiving space to communicate with the receiving space.

4. The mounting method as claimed in claim 3, wherein the limiting units respectively have two opposite ends in contact with the upper and the lower edges of the windows; each of the limiting units being a movable or flexible body radially protruded toward the receiving space and including an inner surface and an outer surface, which are defined as a first and a second surface, respectively; and at least one of the first and the second surface of the limiting unit being a convex surface, and the first surface being protruded toward the receiving space of the sleeve.

5. The mounting method as claimed in claim 3, wherein the limiting units are external elements correspondingly extended through the windows into the receiving space to press on the top end of the spring, such that the spring is limited in the receiving space of the sleeve.

6. The mounting method as claimed in claim 5, wherein the limiting units are selected from the group consisting of flat pieces and transverse sticks, and are extended into the receiving space or snapped onto the sleeve via the two windows, so as to interfere with the spring and limit the same to the receiving space of the sleeve.

* * * * *